(12) United States Patent
Hung et al.

(10) Patent No.: US 9,666,699 B1
(45) Date of Patent: May 30, 2017

(54) SEMICONDUCTOR DEVICE HAVING FIELD PLATE DISPOSED ON ISOLATION FEATURE AND METHOD FOR FORMING THE SAME

(71) Applicant: Vanguard International Semiconductor Corporation, Hsinchu (TW)

(72) Inventors: Pei-Heng Hung, New Taipei (TW); Manoj Kumar, Dhanbad (IN); Hsiung-Shih Chang, Taichung (TW); Chia-Hao Lee, New Taipei (TW); Jun-Wei Chen, Hsinchu (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/085,219

(22) Filed: Mar. 30, 2016

(51) Int. Cl.
*H01L 29/735* (2006.01)
*H01L 29/73* (2006.01)
*H01L 29/06* (2006.01)
*H01L 29/417* (2006.01)
*H01L 29/66* (2006.01)
*H01L 21/8222* (2006.01)
*H01L 21/762* (2006.01)
(Continued)

(52) U.S. Cl.
CPC .... *H01L 29/7302* (2013.01); *H01L 21/76264* (2013.01); *H01L 21/8222* (2013.01); *H01L 29/0649* (2013.01); *H01L 29/402* (2013.01); *H01L 29/41708* (2013.01); *H01L 29/42304* (2013.01); *H01L 29/6609* (2013.01); *H01L 29/6625* (2013.01); *H01L 29/66128* (2013.01); *H01L 29/66136* (2013.01); *H01L 29/735* (2013.01); *H01L 29/861* (2013.01); *H01L 29/8611* (2013.01)

(58) Field of Classification Search
CPC ........... H01L 21/76264; H01L 21/8222; H01L 29/0649; H01L 29/402; H01L 29/41708; H01L 29/42304; H01L 29/6609; H01L 29/66128; H01L 29/66136; H01L 29/6625; H01L 29/7302; H01L 29/735; H01L 29/861; H01L 29/8611
See application file for complete search history.

(56) References Cited

U.S. PATENT DOCUMENTS 5,801,420 A 9/1998 Fujishima
2004/0129983 A1 7/2004 Mallikarjunaswamy
(Continued)

*Primary Examiner* — Stephen W Smoot
(74) *Attorney, Agent, or Firm* — Birch, Stewart, Kolasch & Birch, LLP

(57) ABSTRACT

The invention provides a semiconductor device, including a buried oxide layer disposed on a substrate. A semiconductor layer is disposed on the buried oxide layer. A first well is disposed in the semiconductor layer. A second well and a third well are disposed to opposite sides of the first well and separated from the first well. An isolation feature covers the first well and the third well. A poly field plate is disposed on the isolation feature and over the semiconductor layer between the first well and the third well. A first anode doped region is disposed on the second well. A second anode doped region and a third anode doped region are disposed on the second well. The second anode doped region is positioned directly on the third anode doped region. A first cathode doped region is coupled to the third well.

26 Claims, 11 Drawing Sheets

(51) Int. Cl.
*H01L 29/423* (2006.01)
*H01L 29/40* (2006.01)
*H01L 29/861* (2006.01)

(56) References Cited

U.S. PATENT DOCUMENTS

| | | |
|---|---|---|
| 2005/0036252 A1 | 2/2005 | Hu et al. |
| 2011/0057256 A1 | 3/2011 | Sasaki |
| 2012/0273871 A1 | 11/2012 | Yedinak et al. |
| 2013/0093010 A1* | 4/2013 | Huang ................ H01L 29/7816 257/335 |
| 2014/0167207 A1* | 6/2014 | Kaya .................. H01L 27/0814 257/500 |
| 2015/0014791 A1* | 1/2015 | Coyne ............... H01L 29/66477 257/409 |

* cited by examiner

500# SEMICONDUCTOR DEVICE HAVING FIELD PLATE DISPOSED ON ISOLATION FEATURE AND METHOD FOR FORMING THE SAME

BACKGROUND OF THE INVENTION

Field of the Invention

The present invention relates to a semiconductor device and method for forming the same, and in particular it relates to a fast recovery diode and method for forming the same.

Description of the Related Art

In fast recovery diodes, the majority of carriers of the current pass through the channel region under forward voltage conditions, and reverse recovery time (tRR), which is the time for turning the diode off and taking the minority carriers completely out, is reduced while maintaining soft-recovery properties under reverse voltage conditions since the amount of the reverse recovery electric charges is small. However, the higher the voltage that the fast recovery diodes endure, the longer the reverse recovery time (tRR) that the fast recovery diodes take.

In addition, when metal lines are formed across the fast recovery diodes, the early take off issue and leakage current will occur in the device. Generally, multiple metal layers are formed to make the metal layers away from the device to control these phenomena. However, the manufacturing cost is high for forming multiple metal layers.

Thus, a novel fast recovery diode with large forward current, short reverse recovery time, large reverse recovery softness factor and high-voltage endurance is desirable.

BRIEF SUMMARY OF THE INVENTION

A semiconductor device is provided. An exemplary embodiment of the semiconductor device includes a substrate. A buried oxide layer is disposed on the substrate. A semiconductor layer having a first conduction type is disposed on the buried oxide layer. A first well doped region having the first conduction type is disposed in the semiconductor layer. A second well doped region and a third well doped region having a second conduction type opposite to the first conduction type are disposed close to opposite sides of the first well doped region, wherein the second well doped region and the third well doped region are respectively separated from the first well doped region by a first distance and a second distance. An isolation feature covers the first well doped region and the third well doped region. A poly field plate having the first conduction type or the second conduction type is disposed on the isolation feature and over the semiconductor layer between the first well doped region and the third well doped region. A first anode doped region having the second conduction type is disposed on the second well doped region. A second anode doped region having the first conduction type is disposed on the second well doped region. A third anode doped region having the first conduction type is disposed on the second well doped region, wherein the second anode doped region is positioned directly on the third anode doped region. A first cathode doped region having the second conduction type is coupled to the third well doped region.

A method for forming a semiconductor device is provided. In an exemplary embodiment of the method for forming a semiconductor device, a substrate is provided. A buried oxide layer is formed on the substrate. A semiconductor layer is formed on the buried oxide layer, wherein the semiconductor layer has a first conduction type. A first well doped region is formed in the semiconductor layer, wherein the first well doped region has the first conduction type. A second well doped region and a third well doped region close to opposite sides of the first well doped region are formed, wherein the second well doped region and the third well doped region are respectively separated from the first well doped region by a first distance and a second distance, wherein the second well doped region and the third well doped region have a second conduction type opposite to the first conduction type. An isolation feature covering the first well doped region and the third well doped region is formed. A poly field plate is formed on the isolation feature and over the semiconductor layer between the first well doped region and the third well doped region, wherein the poly field plate has the first conduction type or the second conduction type. A first anode doped region is formed on the second well doped region, wherein the first anode doped region has the second conduction type. A second anode doped region is formed on the second well doped region, wherein the second anode doped region has the first conduction type. A third anode doped region is formed on the second well doped region, wherein the third anode doped region has the first conduction type, wherein the second anode doped region is formed directly on the third anode doped region. A first cathode doped region coupled to the third well doped region is formed, wherein the first cathode doped region has the second conduction type.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
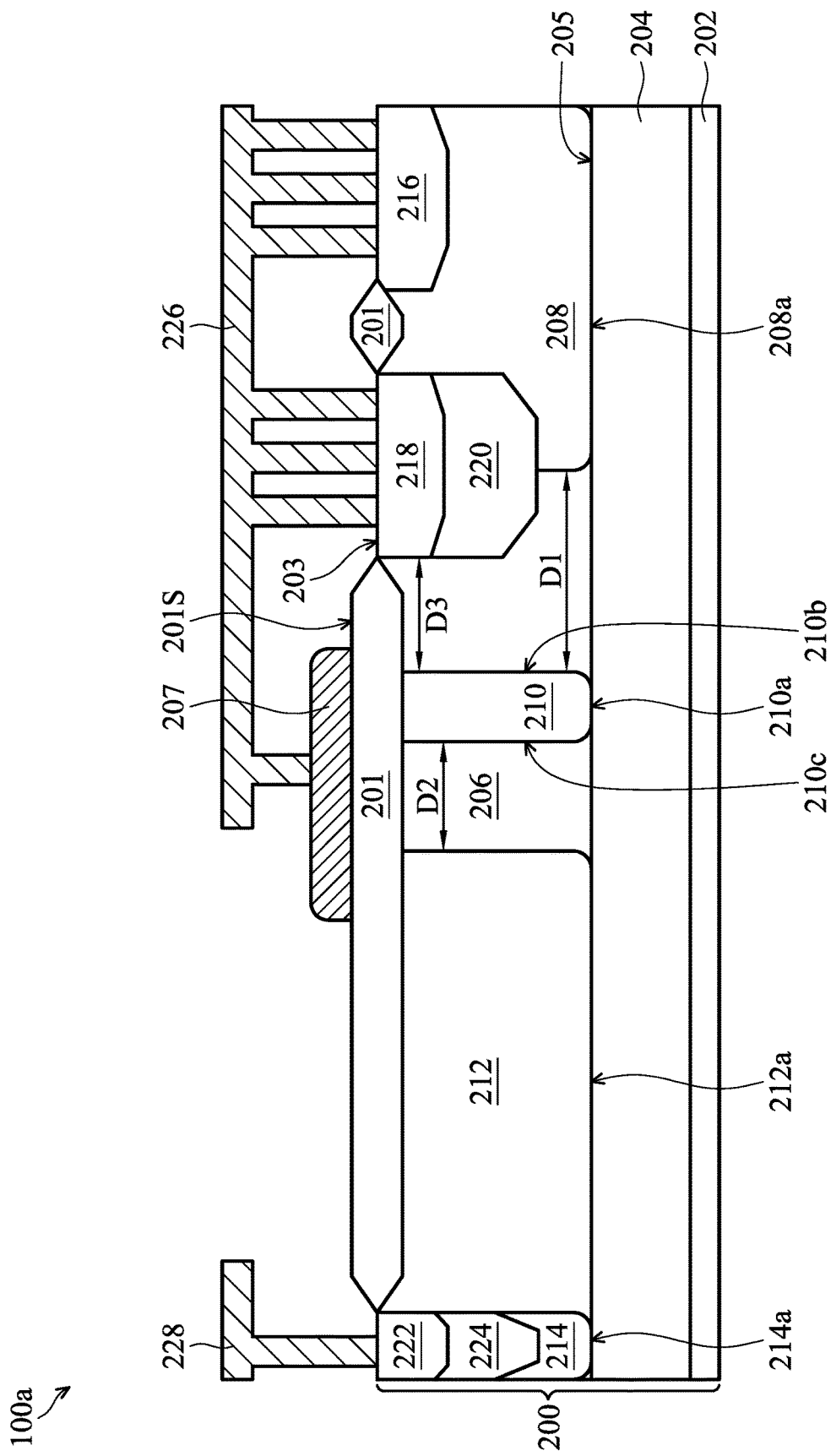
FIG. 1A is a cross-sectional view of a semiconductor device in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and are not drawn to scale. The dimensions and the relative dimensions do not correspond to actual dimensions in the practice of the invention.

Embodiments provide a semiconductor device. In some embodiments, the semiconductor is a lateral fast recovery diode. The lateral fast recovery diode utilizes a design concept of a lateral bipolar junction transistor (lateral BJT). The area of the device can be significantly reduced and the driving ability of the current is increased. In addition, by disposing a poly field plate across the pn junction of the lateral bipolar junction transistor, the number of metal layers used in the subsequent processes is reduced, thereby preventing the early take off issue and leakage current, which generally occur when metal layers are formed across the semiconductor device. In some embodiments, the semiconductor device is formed on a silicon-on-insulator (SOI) substrate, thereby suppressing the latch-up effect generated by a parasitic bipolar junction transistor (BJT) and the leakage current of the semiconductor device is also significantly suppressed.

Figure 1B:
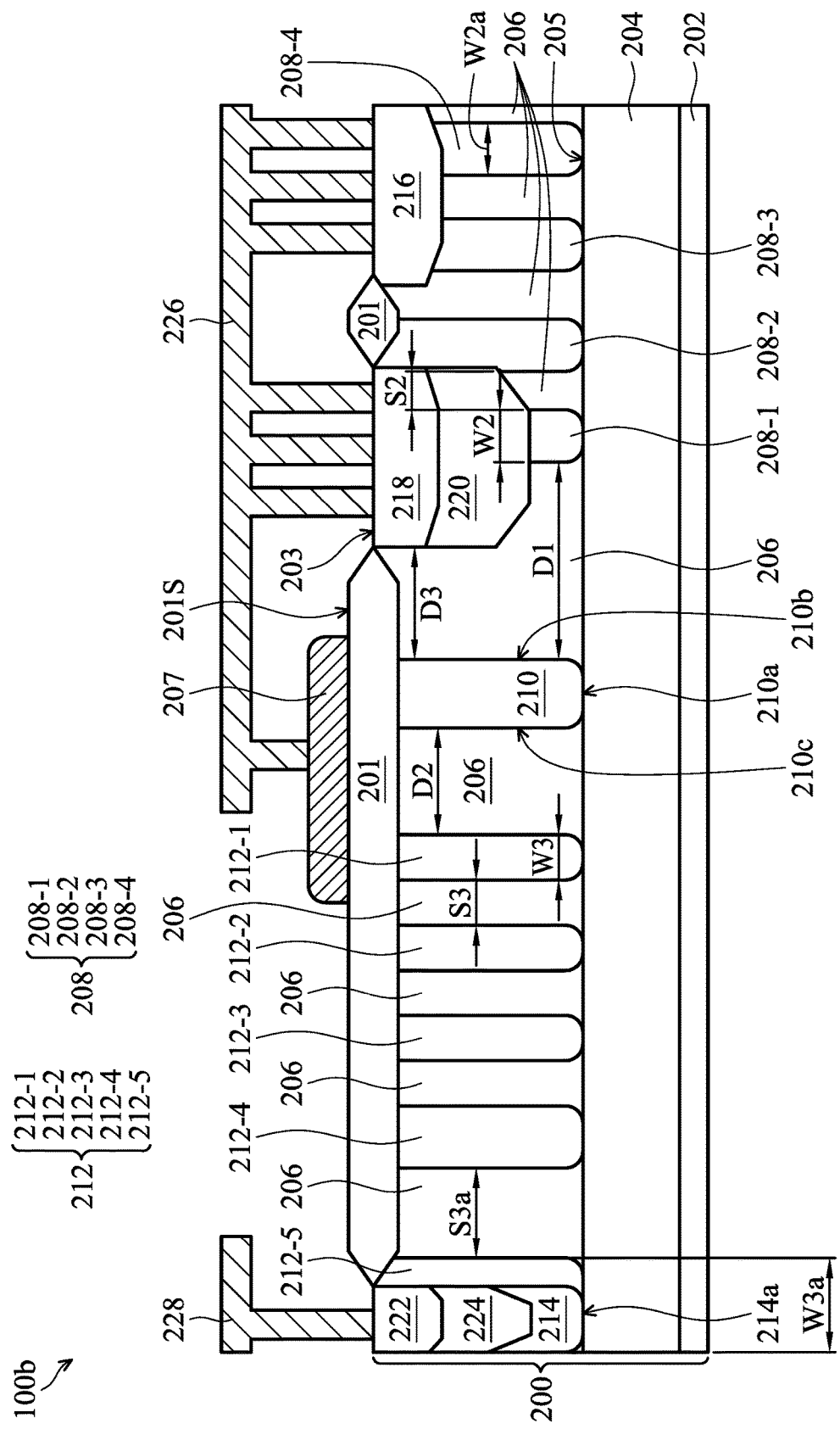
FIG. 1B is a cross-sectional view of a semiconductor device in accordance with some embodiments of the disclosure.
Figure 1C:
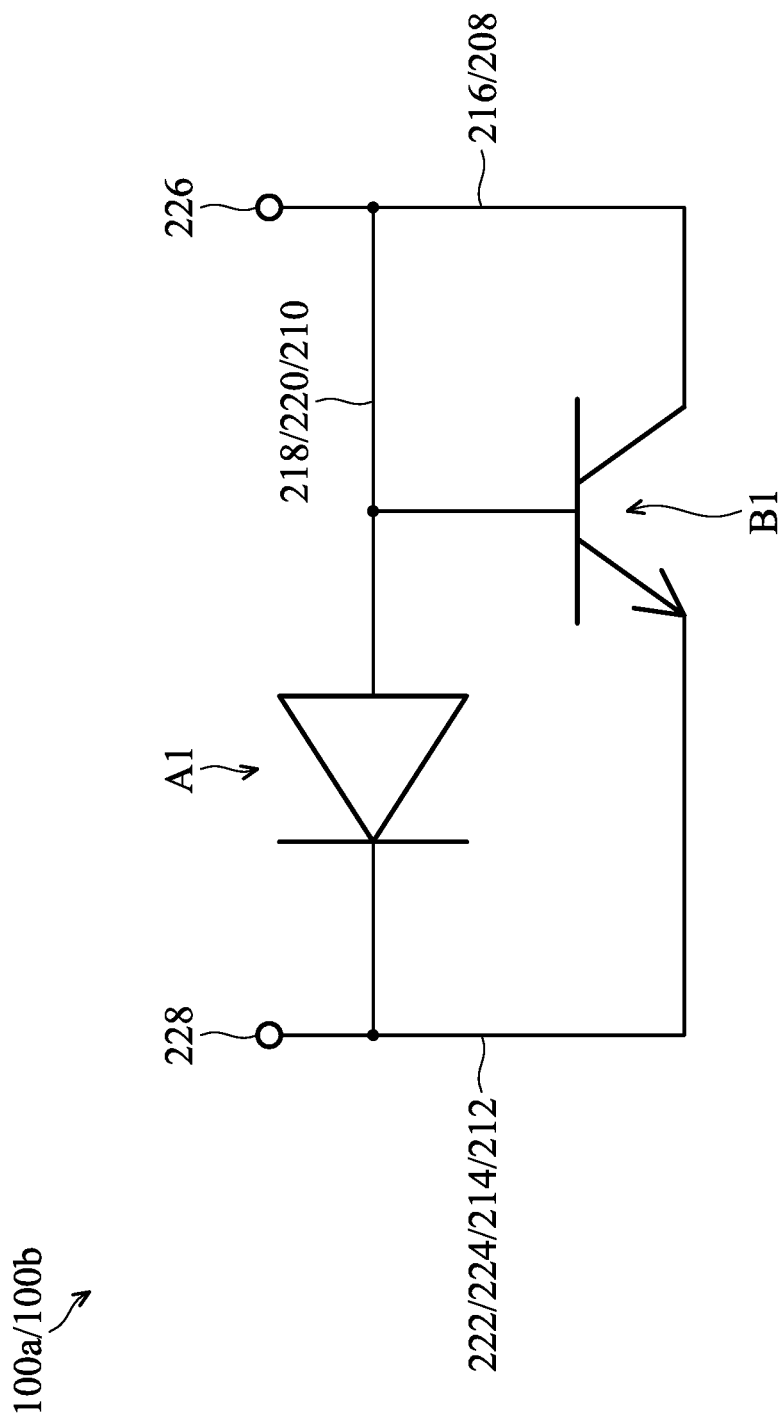
FIG. 1C is an equivalent circuit diagram of the semiconductor devices shown in FIGS. 1A and 1B.

FIGS. 1A and 1B are cross-sectional views of the semiconductor devices 100a and 100b in accordance with some embodiments of the disclosure. FIG. 1C is an equivalent circuit diagram of the semiconductor devices 100a and 100b shown in FIGS. 1A and 1B.

As shown in FIG. 1A, the semiconductor device 100a in accordance with some embodiments of the disclosure includes a semiconductor substrate 200, for example, a silicon-on-insulator (SOI) substrate or a bulk silicon substrate. In some embodiments, the semiconductor substrate 200 includes a substrate 202, a buried oxide layer 204, and a semiconductor layer 206. The buried oxide layer 204 is disposed on the substrate 202, and the semiconductor layer 206 is disposed on the buried oxide layer 204. The semiconductor layer 206 of the semiconductor substrate 200 has a first conduction type, and the substrate 202 has a second conduction type opposite to the first conduction type. The substrate 202 and the semiconductor layer 206 are separated from each other through the buried oxide layer 204. For example, the substrate 202 may be an n-type substrate, and the semiconductor layer 206 may be a p-type semiconductor layer. In some embodiments, and the thickness of the semiconductor substrate 200 may be in a range of about 2 μm-10 μm, the thickness of the buried oxide layer 204 may be in a range of about 0.4 μm-3 μm.

As shown in FIG. 1A, the semiconductor device 100a includes a first well doped region 210, a second well doped region 208 and a third well doped region 212 disposed in the semiconductor layer 206 and laterally separated from each other. The first well doped region 210 has the first conduction type. The second well doped region 208 and the third well doped region 212 having the second conduction type are respectively close to opposite sides 210b and 210c of the first well doped region 210. The second well doped region 208 and the third well doped region 212 are respectively separated from the sides 210b and 210c of the first well doped region 210 by a first distance D1 and a second distance D2. For example, the first well doped region 210 is a high-voltage p-well (HVPW) doped region and the second well doped region 208 and the third well doped region 212 are high-voltage n-well (HVNW) doped regions. Also, the dopant concentration of the first well doped region 210 may be greater than that of the semiconductor layer 206. In some embodiments, the first distance D1 is equal to or less than the second distance D2. In some embodiments, a bottom boundary 210a of the first well doped region 210, a bottom boundary 208a of the second well doped region 208, and a bottom boundary 212a of the third well doped region 212 may be in contact with an interface 205 of the semiconductor layer 206 and the buried oxide layer 204. In some other embodiments, the bottom boundary 210a of the first well doped region 210, the bottom boundary 208a of the second well doped region 208, and the bottom boundary 212a of the third well doped region 212 may be separated from the interface 205 of the semiconductor layer 206 and the buried oxide layer 204 through the semiconductor layer 206.

As shown in FIG. 1A, the semiconductor device 100a includes one or more isolation features 201 formed on the surface 203 of the semiconductor layer 206. The isolation features 201 may be used to define an active region of the semiconductor device 100a. As shown in FIG. 1A, one of the isolation features 201 is formed extending from a side boundary of the third well doped region 212, which is away from the first well doped region 210, to a side boundary of the second well doped region 208, which is close to the first well doped region 210. Also, one of the isolation features 201 covers the first well doped region 210 and the third well doped region 212, so that the first well doped region 210 and the third well doped region 212 are positioned directly below the isolation feature 201. Another isolation feature 201 shown in FIG. 1A covers a portion of the second well doped region 208, so that formation positions of an anode doped region subsequently formed therein are defined. In some embodiments, the isolation feature 201 covering the portion of the second well doped region 208 is not formed. In some embodiments, the isolation features 201 may comprise local oxidation of silicon (LOCOS) features or shallow trench isolation (STI) features. In some embodiment, without changing the width of the first well doped region 210, the width of the second well doped region 208, the first distance D1 between the first well doped region 210 and the second well doped region 208, and the second distance D2 between the first well doped region 210 and the third well doped region 212, the isolation features 201 may have a greater width with an increase of the width of the third well doped region 212. Since the high electric field area is away from the pn junction, an electric field distribution with a smoother curve is formed. So, the blocking voltage of the semiconductor device 100a can be increased.

As shown in FIG. 1A, the semiconductor device 100a includes a poly field plate 207 having the first conduction type or the second conduction type disposed on the isolation feature 201 and over the semiconductor layer 206 between the first well doped region 210 having the first conduction type and the third well doped region 212 having the second conduction type. It should be noted that the poly field plate 207 is formed across the junction of the well region with opposite conduction types. For example, when the first conduction type is p-type and the second conduction type is n-type, the poly field plate 207 is formed across the pn junction composed of the first well doped region 210 and the third well doped region 212. The field plate is used to improve the terminal electric field distribution of the device, so that an electric field shield effect is formed. Therefore, the metal layers used in the subsequent processes are reduced. The early take off issue and leakage current, which generally occur when metal layers are formed across the semiconductor device, are suppressed. Also, the blocking voltage of the semiconductor device is increased. In some embodiments, the poly field plate 207 may be a metal conductive plate, an in-situ doped polysilicon, or a doped polysilicon.

As shown in FIG. 1A, the semiconductor device 100a includes a first anode doped region 216 disposed on the second well doped region 208. The second anode doped region 208, the third anode doped region 220 partially overlap with the second well doped region 218. The first anode doped region 216 has the second conduction type, and the second anode doped region 218 has the first conduction type. The second anode doped region 218 may be laterally separated from the first anode doped region 216 by a distance through the isolation feature 201. The third anode doped region 220 has the first conduction type. Also, the second anode doped region 218 is formed directly on and connected to the third anode doped region 220. Also, bottom boundaries of the second anode doped region 218 and the third anode doped region 220 are separated from the buried oxide layer 204. Furthermore, the second anode doped region 218 is separated from the first well doped region 210 by a third distance D3. In this embodiment, a part of the second anode doped region 218 and a part of the third anode doped region 220 outside the boundary of the second well doped region 208 are laterally (substantially parallel to the surface 203 of the semiconductor layer 206) disposed in the semiconductor layer 206 between the first well doped region 210 and the third well doped region 208, so that the third distance D3 is smaller than the first distance D1.

In some embodiments, the dopant concentration of the first anode doped region 216 is greater than that of the second well doped region 208. The dopant concentration of the second anode doped region 218 is greater than that of the third anode doped region 220. Also, the dopant concentration of the third anode doped region 220 is greater than that of the first well doped region 210. For example, the first anode doped region 216 is an n-type heavily (N$^+$) doped region, the second anode doped region 218 is a p-type heavily (P$^+$) doped region, and the third anode doped region 220 is a p-type lightly doped source/drain (PLDD) region. Additionally, the first anode doped region 216, the second anode doped region 218, and the third anode doped region 220 are collectively coupled to an anode electrode 226.

As shown in FIG. 1A, the semiconductor device 100a includes a fourth well doped region 214 having the second conduction type. A dopant concentration of the fourth well doped region 214 is greater than that of the third well doped region 212. For example, the fourth well doped region 214 is an n-type well (NW) doped region. The fourth well doped region 214 is adjacent to a side of the third well doped region 212, which is away from the first well doped region 210. In other words, the fourth well doped region 214 is separated from the first well doped region 210 through at least the third well doped region 212. In some embodiments, a bottom boundary 214a of the fourth well doped region 214 is in contact with the interface 205 of the semiconductor layer 206 and the buried oxide layer 204. The fourth well doped region 214 is exposed from the isolation features 201.

As shown in FIG. 1A, a first cathode doped region 222 and a second cathode doped region 224, which have the second conduction type, are disposed on the fourth well doped region 214. Also, the first cathode doped region 222 is positioned directly on the second cathode doped region 224. The dopant concentration of the first cathode doped region 222 is greater than that of the second cathode doped region 224. The dopant concentration of the second cathode doped region 224 is greater that of the fourth well doped region. For example, the first cathode doped region 222 is an n-type heavily (N) doped region, and the second cathode doped region 224 is an n-type lightly doped source/drain (NLDD) region. The first cathode doped region 222 and the second cathode doped region 224 are coupled to a cathode electrode 228. Also, the first cathode doped region 222 is coupled to the third well doped region 212 through the second cathode doped region 224 and the fourth well doped region 214.

The dopant concentration of the poly field plate 207 may be the same as that of the first anode doped region 216, the second anode doped region 218, or the first cathode doped region 222, for example.

FIG. 1B is a cross-sectional view of a semiconductor device 100b in accordance with some embodiments of the disclosure. One of the differences between the semiconductor device 100b and the semiconductor device 100a is that the second well doped region 208 and the third well doped region 212 of the semiconductor device 100b are respectively composed of a plurality of strip-shaped sub-well doped regions separated from each other. As shown in FIG. 1B, the second well doped region 208 of the semiconductor device 100b is composed of a plurality of strip-shaped second sub-well doped regions 208-1, 208-2, 208-3, 208-4, and 208-5 separated from each other. The second sub-well doped regions 208-1-208-5 extend from a surface 203 of the semiconductor layer 206 down to the buried oxide layer 204. The third well doped region 212 of the semiconductor device 100b is composed of a plurality of strip-shaped third sub-well doped regions 212-1, 212-2, 212-3, 212-4 and 212-5 separated from each other. The third sub-well doped regions 212-1-212-5 extend from the surface 203 of the semiconductor layer 206 down to the buried oxide layer 204. Compared with the second well doped region 208 and the third well doped region 212 of the semiconductor device 100a, the second well doped region 208 and the third well doped region 212 of the semiconductor device 100b are respectively composed of a plurality of strip-shaped sub-well doped regions, so that the total dopant concentrations of the second well doped region 208 and the third well doped region 212 can be reduced. Therefore, the blocking voltage of the semiconductor device 100b can be increased. It should be noted that the number of strip-shaped second sub-well doped regions or the number of strip-shaped third sub-well doped regions are defined according to the design, but they are not limited to the disclosed embodiments.

As shown in FIG. 1B, the width W2 of the strip-shaped second sub-well doped region 208-1, which is close to the first well doped region 210, may be designed to be smaller than the width W2a of the strip-shaped second sub-well doped region 208-5, which is farther away from the first well doped region 210 than the strip-shaped second sub-well doped regions 208-1-208-4. The strip-shaped second sub-well doped region 208-1, which is close to the first well doped region 210, is separated from the adjacent strip-shaped second sub-well doped region 208-2 by a space S2. The space S2 may be designed to be greater than the width W2 of the strip-shaped second sub-well doped region 208-1 and the width W2a of the strip-shaped second sub-well doped region 208-5.

As shown in FIG. 1B, the width W3 of the strip-shaped third sub-well doped region 212-1, which is close to the first well doped region 210, may be designed to be smaller than the width W3a of the strip-shaped third sub-well doped region 212-5, which is farther away from the first well doped region 210 than the strip-shaped third sub-well doped regions 212-1-212-4. The strip-shaped third sub-well doped region 212-1, which is close to the first well doped region 210, is separated from the adjacent strip-shaped third sub-well doped region 212-2 by a space S3. The strip-shaped third sub-well doped region 212-5, which is close to the fourth well doped region 214, is separated from the adjacent strip-shaped third sub-well doped region 212-4 by a space S3a. The space S3 may be designed to be greater than the width W3 of the strip-shaped third sub-well doped region 212-1. The space S3a may be designed to be greater than the width W3a of the strip-shaped third sub-well doped region 212-5. Also, the space S3 may be designed to be smaller than the space S3a.

FIG. 1C is an equivalent circuit diagram of the semiconductor devices 100a and 100b in accordance with some embodiments of the disclosure shown in FIGS. 1A and 1B. As shown in FIGS. 1A-1C, the first anode doped region 216, the second anode doped region 218, the third anode doped region 220, the second well doped region 208 the first well doped region 210, the third well doped region 212, the fourth well doped region 214, the first cathode doped region 222, and the second cathode dope region 224 of the semiconductor device 100a or the semiconductor device 100b collectively form a first bipolar junction transistor B1. The first anode doped region 216 and the second well doped region 208 serve as a collector of the first bipolar junction transistor B1. The second anode doped region 218, the third anode doped region 220, and the first well doped region 210 serve as a base of the first bipolar junction transistor B1. Also, the third well doped region 212, the fourth well doped region 214, the first cathode doped region 222, and the second cathode doped region 224 serves as an emitter of the first bipolar junction transistor B1. In some embodiments, when the first conduction type is p-type and the second conduction type is n-type, the first bipolar junction transistor B1 may serve as a NPN bipolar junction transistor.

In addition, as shown in FIGS. 1A-1C, the second anode doped region 218, the third anode doped region 220, the first well doped region 210, the third well doped region 212, the fourth well doped region 214, the first cathode doped region 222, and the second cathode doped region 224 of the semiconductor device 100a or the semiconductor device 100b collectively form a (parasitic) diode A1. The second anode doped region 218, the third anode doped region 220, and the first well doped region 210 may serve as a first electrode of the diode A1. The third well doped region 212, the fourth well doped region 214, the first cathode doped region 222, and the second cathode doped region 224 may serve as a second electrode of the diode A1. The base of the first bipolar junction transistor B1 of the semiconductor device 100a or the semiconductor device 100b is coupled to the first electrode of the diode A1, and the emitter of the first bipolar junction transistor B1 is coupled to the second electrode of the diode A1. In some embodiment, when the first conduction type is p-type, and the second conduction type is n-type, the first bipolar junction transistor B1 may serve as a NPN bipolar junction transistor. The first electrode of the diode A1 is an anode (p-electrode) and the second electrode is a cathode (n-electrode).

Therefore, the second anode doped region 218, the third anode doped region 220, the first well doped region 210, the third well doped region 212, the fourth well doped region 214, the first cathode doped region 222, and the second cathode doped region 224 of the semiconductor device 100a or the semiconductor device 100b may collectively form a diode. The diode is formed by another diode, which is composed of the base and the emitter of the first bipolar junction transistor B1, and the (parasitic) diode A1, which are connected in parallel. As shown in FIG. 1C, the second anode doped region 218, the third anode doped region 220, and the first well doped region 210, which are coupled to the anode electrode 226, may serve as a first electrode of the diode. The third well doped region 212, the fourth well doped region 214, the first cathode doped region 222 and the second cathode doped region 224, which are coupled to the cathode electrode 228, may serve as a second electrode of the diode. In some embodiments, when the first conduction type is p-type and the second conduction type is n-type, the second anode doped region 218, the third anode doped region 220, and the first well doped region 210, which are coupled to the anode electrode 226, may serve as an anode (p-electrode) of the diode. The third well doped region 212, the fourth well doped region 214, the first cathode doped region 222, and the second cathode doped region 224, which are coupled to the cathode electrode 228, may serve as a cathode (n-electrode) of the diode.

Figure 2:
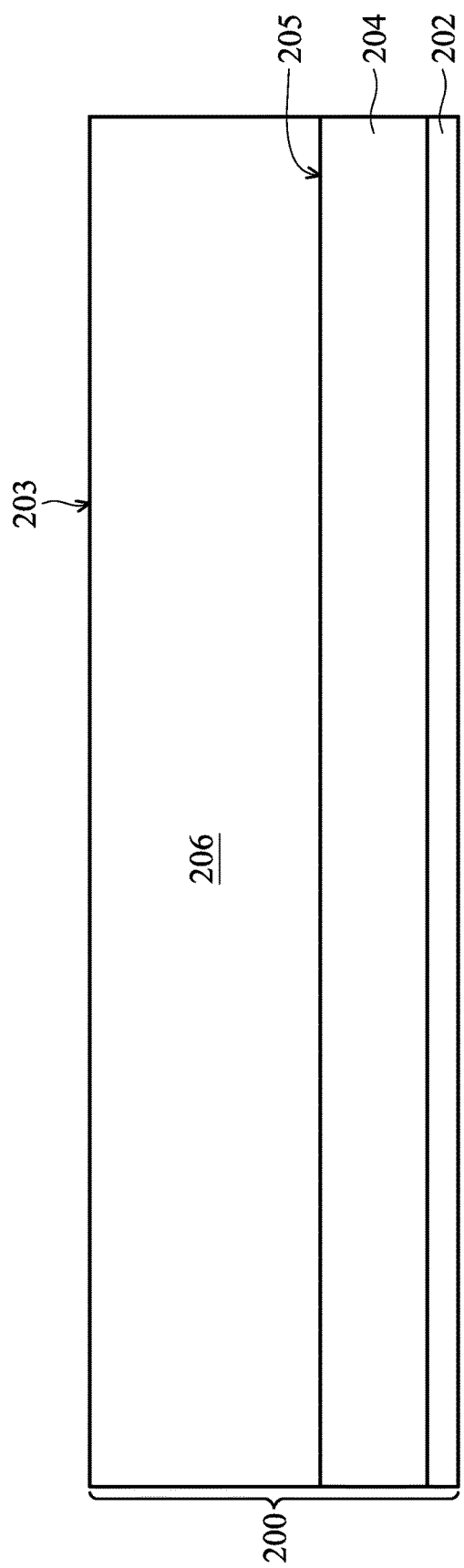
FIG. 2 is a cross-sectional view of an intermediate stage of a method for fabricating a semiconductor device in accordance with some embodiments of the disclosure.

FIGS. 2-8 are cross-sectional views of intermediate stages of a method for fabricating the semiconductor device 100a in accordance with some embodiments of the disclosure. As shown in FIG. 2, a semiconductor substrate 200 is provided. The semiconductor substrate 200 includes the substrate 202, the buried oxide layer 204 vertically laminating on the substrate 202, and the semiconductor layer 206 vertically laminating on the buried oxide layer 204. For example, the substrate 202 may be an n-type substrate and the semiconductor layer 206 may be a p-type semiconductor layer. Also, the substrate 202 and the semiconductor layer 206 are separated from each other through the buried oxide layer 204.

Figure 3:
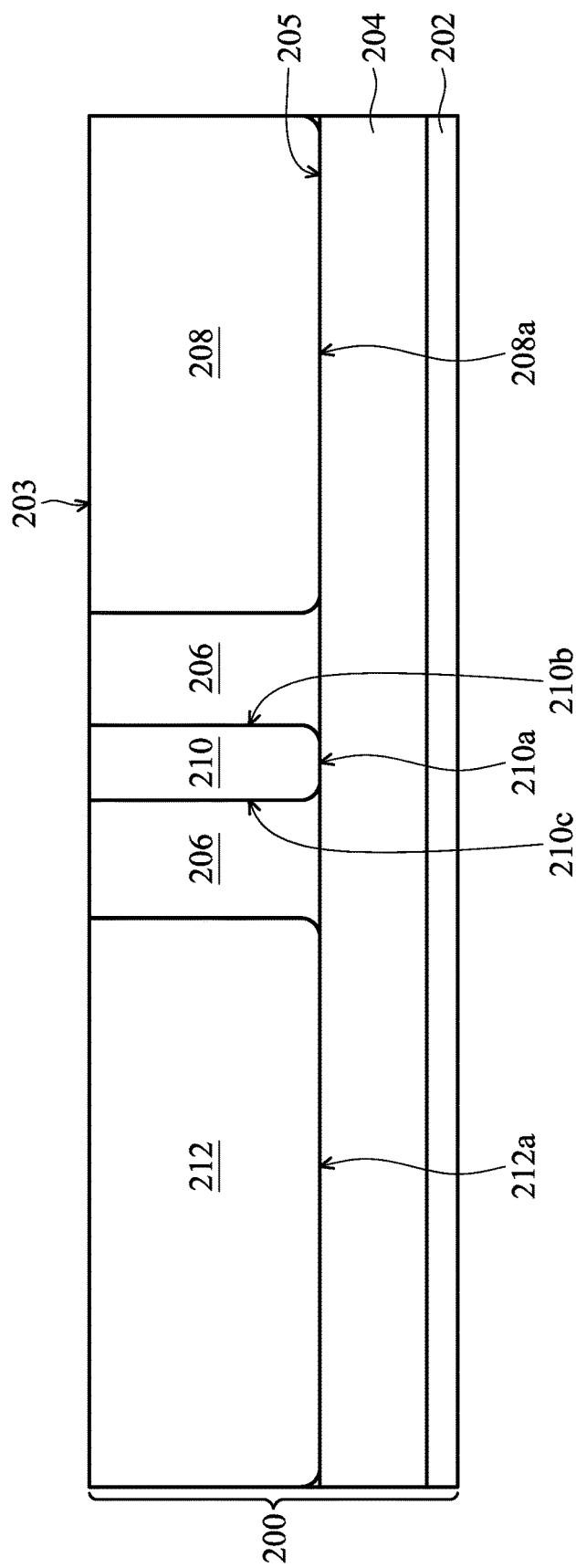
FIG. 3 is a cross-sectional view of an intermediate stage of a method for fabricating a semiconductor device in accordance with some embodiments of the disclosure.

Next, a photolithography process is performed to form a photoresist pattern on the surface 203 of the semiconductor layer 206 as shown in FIG. 3. Next, an ion implantation process is performed using the photoresist pattern as a mask to implant the dopants having the first conduction type into a portion of the semiconductor layer 206. Therefore, the first well doped region 210 is formed in the semiconductor layer 206. Next, the photoresist pattern is removed.

Next, another photolithography process is performed to form another photoresist pattern on the surface 203 of the semiconductor layer 206. Next, another ion implantation process is performed using the photoresist pattern as a mask to implant the dopants having the second conduction type into portions of the semiconductor layer 206. Therefore, the second well doped region 208 and the third well doped region 212 are formed in portions of the semiconductor layer 206, which are close to two opposite sides 210b and 210c of the first well doped region 210. Next, the photoresist pattern is removed. Because the conduction type of the second well doped region 208 is the same as that of the third well doped region 212, the second well doped region 208 and the third well doped region 212 may be formed during a single ion implantation process. In some embodiments, the sequence of the ion implantation process of forming the first well doped region 210, and the ion implantation process of forming the second well doped region 208 and the third well doped region 212, may be exchanged.

Figure 4:
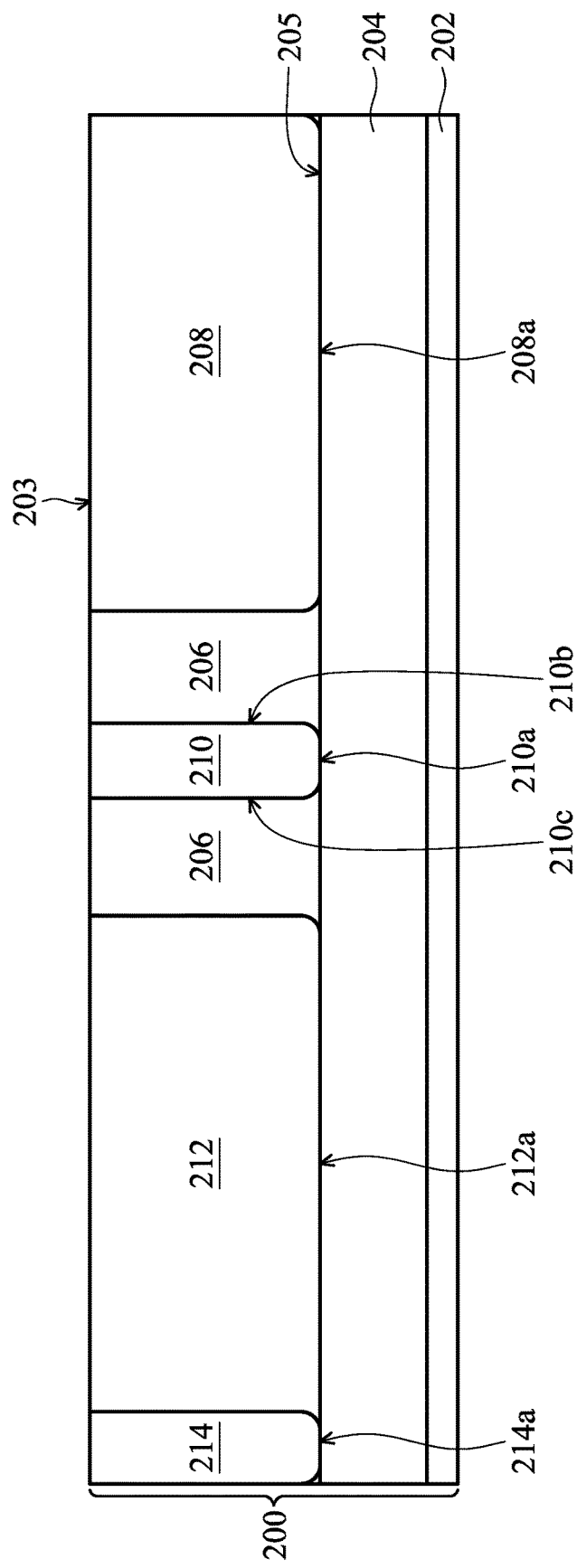
FIG. 4 is a cross-sectional view of an intermediate stage of a method for fabricating a semiconductor device in accordance with some embodiments of the disclosure.

Next, another photolithography process is performed to form another photoresist pattern on the surface 203 of the semiconductor layer 206 as shown in FIG. 4. Next, another ion implantation process is performed using the photoresist pattern as a mask to implant the dopants having the second conduction type into a portion of the semiconductor layer 206, which is positioned at a side of the third well doped region 212. Also, the side of the third well doped region 212 is farther away from the first well doped region 210. Therefore, the fourth well doped region 214 adjacent to the third well doped region 212 is formed. Next, the photoresist pattern is removed. In some embodiments, the dopant concentration of the fourth well doped region 214 is greater than that of the third well doped region 212.

Figure 5:
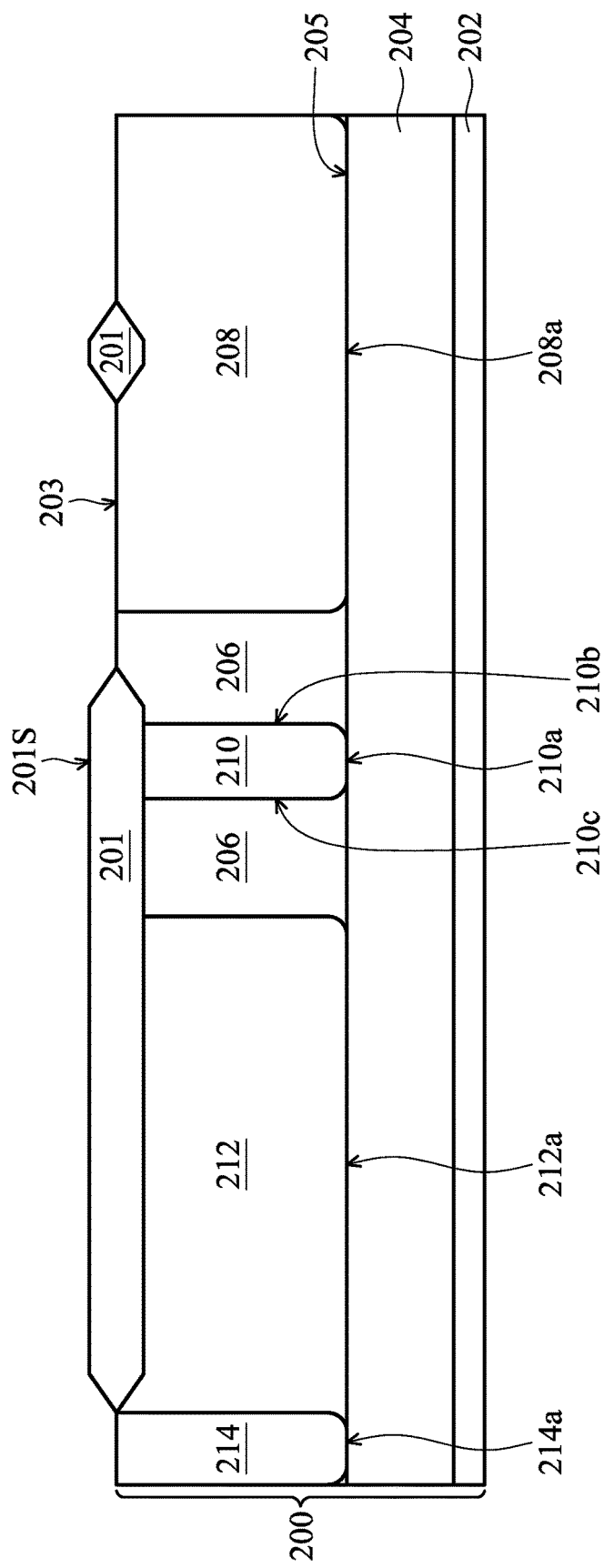
FIG. 5 is a cross-sectional view of an intermediate stage of a method for fabricating a semiconductor device in accordance with some embodiments of the disclosure.

Next, a local oxidation of silicon (LOCOS) process or a shallow trench isolation (STI) process is performed to form one or more isolation features 201 on the surface 203 of the semiconductor layer 206 as shown in FIG. 5. The active regions of the semiconductor device 100a are defined by the isolation features 201. In some embodiments, the second well doped region 208 and fourth well doped region 214 are exposed from the isolation features 201.

Figure 6:
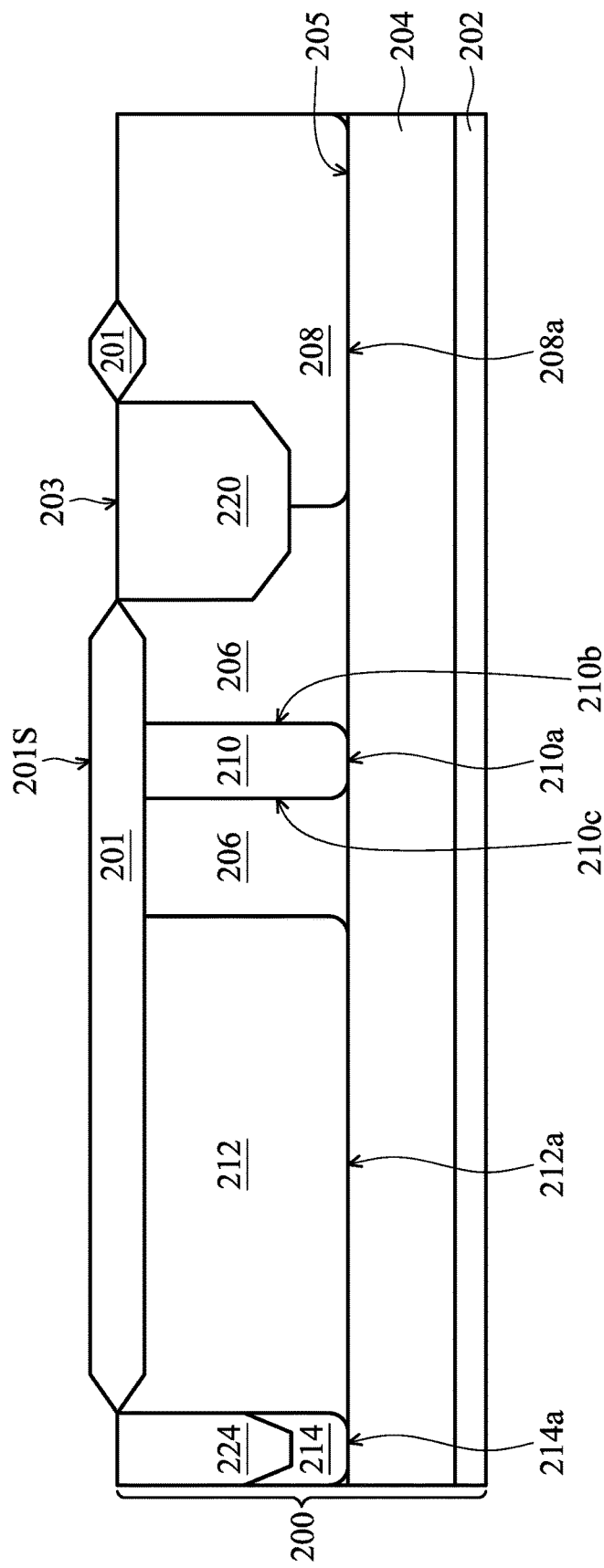
FIG. 6 is a cross-sectional view of an intermediate stage of a method for fabricating a semiconductor device in accordance with some embodiments of the disclosure.

Next, yet another photolithography process is performed to form yet another photoresist pattern on the surface 203 of the semiconductor layer 206 as shown in FIG. 6. Next, yet another ion implantation process is performed using the photoresist pattern as a mask to implant the dopants having the first conduction type into a portion of the second well doped region 208. Therefore, the third anode doped region 220 is formed. Next, the photoresist pattern is removed.

Next, yet another photolithography process is performed to form yet another photoresist pattern on the surface 203 of the semiconductor layer 206. Next, yet another ion implantation process is performed using the photoresist pattern as a mask to implant the dopants having the second conduction type into a portion of the fourth well doped region 214. Therefore, the second cathode doped region 224 is formed. Next, the photoresist pattern is removed. In some embodiments, the sequence of the ion implantation processes of forming the third anode doped region 220 and the second cathode doped region 224 may be exchanged. In some embodiments, a bottom boundary of the third anode doped region 220 is positioned within the second well doped region 208. Also, a bottom boundary of the second cathode doped region 224 is positioned within the fourth well doped region 214.

Figure 7:
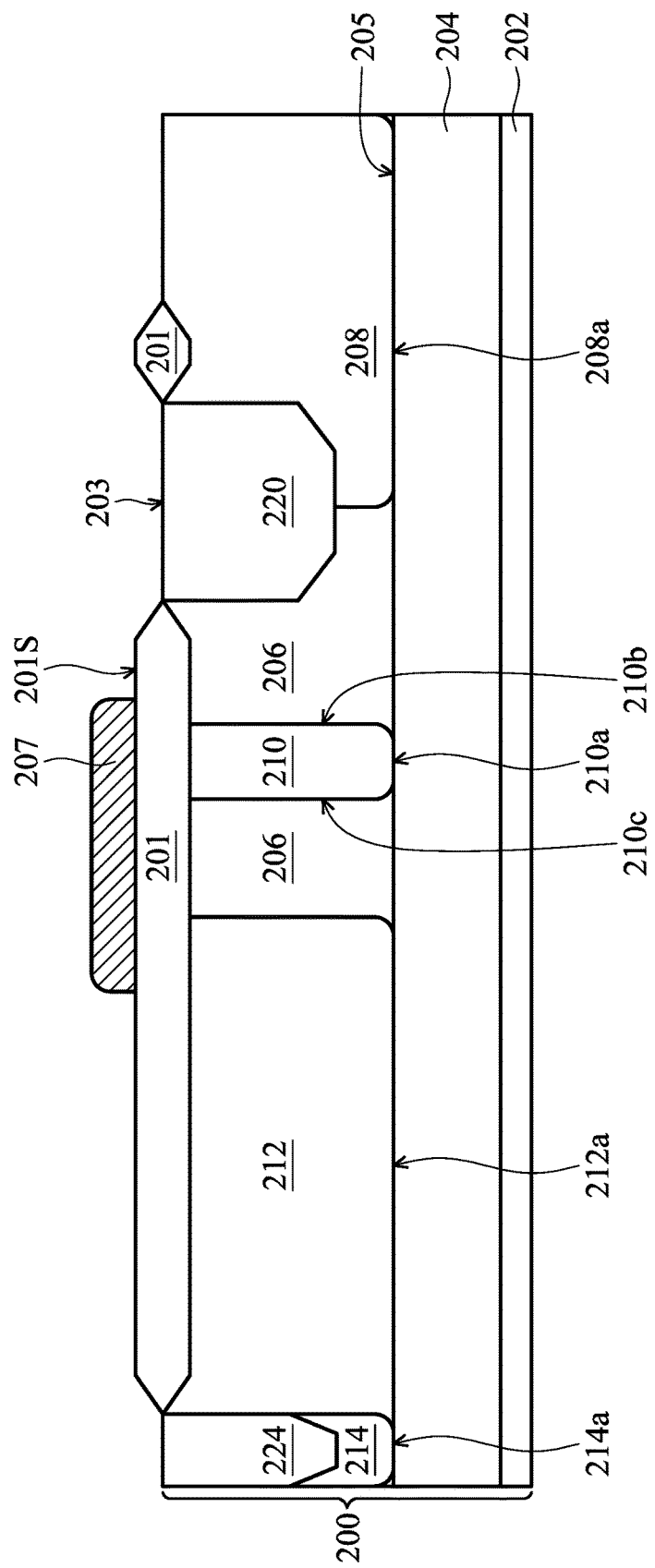
FIG. 7 is a cross-sectional view of an intermediate stage of a method for fabricating a semiconductor device in accordance with some embodiments of the disclosure.

Next, as shown in FIG. 7, a deposition process of the poly field plate is performed. The poly field plate 207 is formed on the surface 201S of the isolation feature 201. The poly field plate 207 is formed over the semiconductor layer 206 between the first well doped region 210, which has the first conduction type, and the third well doped region 212, which has the second conduction type. In some embodiments, the poly field plate 207 deposited in FIG. 7 may be a metal plate or an in-situ doped polysilicon. The steps shown in FIG. 8 are performed subsequently.

Figure 8:
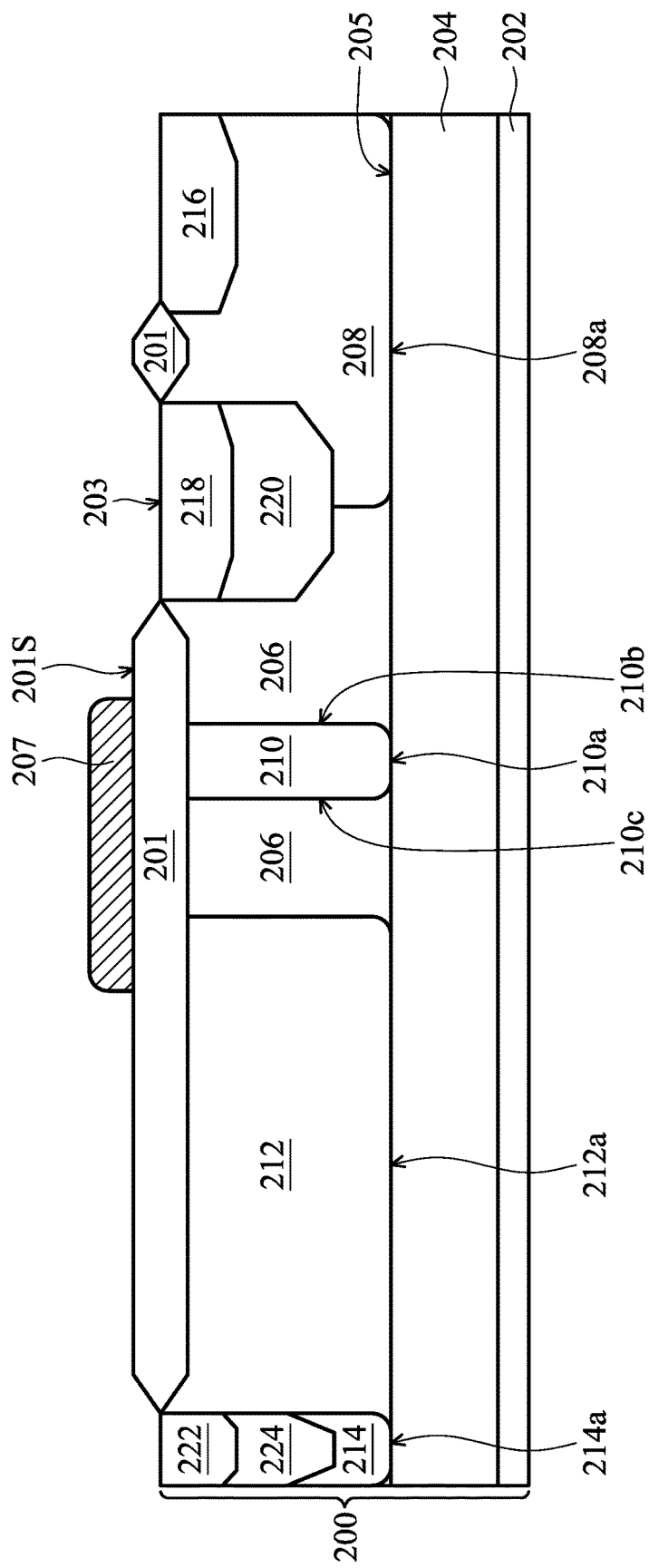
FIG. 8 is a cross-sectional view of an intermediate stage of a method for fabricating a semiconductor device in accordance with some embodiments of the disclosure.

Next, several photolithography processes and subsequent ion implantation processes are performed to form the first anode doped region 216, which has the second conduction type, and the second anode doped region 218, which has the first conduction type, on a portion of the second well doped region 208 as shown in FIG. 8. Also, the first cathode doped region 222, which has the second conduction type, is formed on a portion of the fourth well doped region 214. In this embodiment, the second anode doped region 218 and the third anode doped region 220 partially overlap with the second well doped region 208. Because the conduction type and the dopant concentration of the first anode doped region 216 are the same as those of the first cathode doped region 222, the first anode doped region 216 and the first cathode doped region 222 may be formed during a single ion implantation process. In some embodiments, a bottom boundary of the first anode doped region 216 is positioned within the second well doped region 208. A bottom boundary of the second anode doped region 218 is positioned within the third anode doped region 220. Also, a bottom boundary of the first cathode doped region 222 is positioned within the second cathode doped region 224.

It should be noted that, in some embodiments, the poly field plate 207 deposited in FIG. 7 is an undoped polysilicon. Before performing the steps shown in FIG. 8, another photoresist pattern is formed on the surface 203 of the semiconductor layer 206 and the surface 201S of the isolation feature 201. An ion implantation process is performed using the photoresist pattern as a mask to implant the dopant having the first conduction type or second conduction type into the poly field plate 207. In one embodiment, the poly field plate 207 deposited in FIG. 7 has the second conduction type after being doped. Because the conduction type and the dopant concentration of the poly field plate 207 are the same as those of the first anode doped region 216 and the first cathode doped region 222, the poly field plate 207, the first anode doped region 216, and the first cathode doped region 222 may be formed during a single ion implantation process. In another embodiment, the poly field plate 207 deposited in FIG. 7 has the first conduction type after being doped. Because the conduction type and the dopant concentration of the poly field plate 207 are the same as those of the second anode doped region 218, the poly field plate 207 and the second anode doped region 218 may be formed during a single ion implantation process.

Next, an interconnection process is performed to form the anode electrode 226, which is coupled to the first anode doped region 216, the second anode doped region 218 and the third anode doped region 220, on the semiconductor substrate 200 as shown in FIG. 1A. Additionally, the cathode electrode 228, which is coupled to the first cathode doped region 222 and the second cathode doped region 224, is formed on the semiconductor substrate 200. After performing the aforementioned processes, the semiconductor device 100a is completely formed.

In some other embodiments, a plurality strip-shape photoresist patterns may be used for the subsequent ion implantation processes to form the second well doped region 208, which is composed of a plurality of strip-shaped second sub-well doped regions 208-1, 208-2, 208-3, 208-4, and 208-5 separated from each other as shown in FIG. 1B, during the formation of the second well doped region 208 as shown in FIG. 3. Also, a plurality strip-shape photoresist patterns can be used for the subsequent ion implantation processes to form the third well doped region 212, which is composed of a plurality of strip-shaped third sub-well doped regions 212-1, 212-2, 212-3, 212-4, and 212-5 separated from each other as shown in FIG. 1B, during the formation of the third well doped region 212 as shown in FIG. 3. Next, the processes shown in FIGS. 4-8 are sequentially performed to form the fourth well doped region 214, the first anode doped region 216, the second anode doped region 218, the third anode doped region 220, the first cathode doped region 222, and the second cathode doped region 224 in the semiconductor layer 206. Finally, an interconnection process is performed to form the anode electrode 226, which is coupled to the first anode doped region 216, the second anode doped region 218, and the third anode doped region 220, on the semiconductor substrate 200 as shown in FIG. 1B. Additionally, the cathode electrode 228, which is coupled to the first cathode doped region 222 and the second cathode doped region 224, is formed on the semiconductor substrate 200. After performing the aforementioned processes, the semiconductor device 100b is completely formed.

Figure 9:
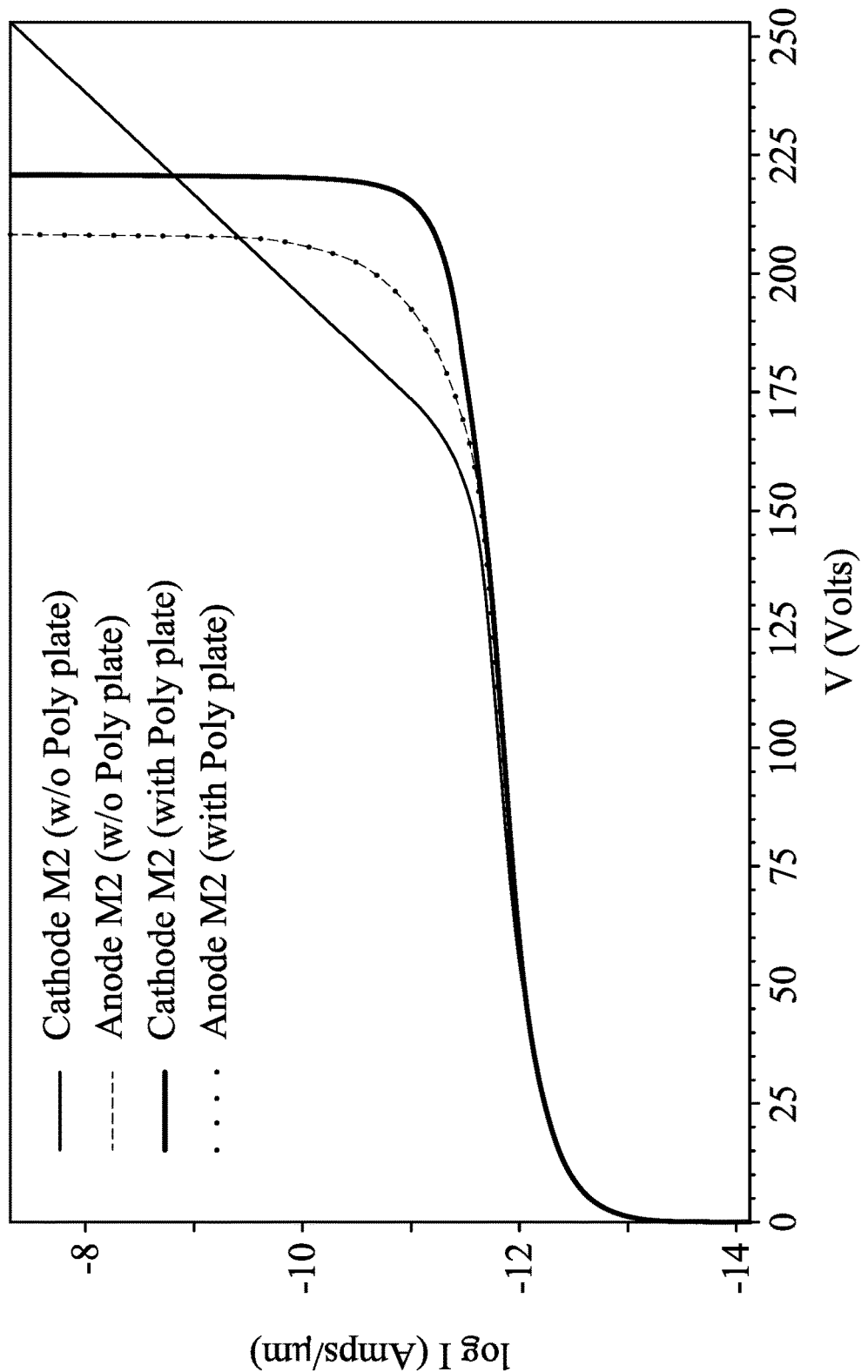
FIG. 9 illustrates a current-voltage characteristic curve of a semiconductor device in accordance with an embodiment of the disclosure.

FIG. 9 illustrates a current-voltage characteristic curve of a semiconductor device in accordance with an embodiment of the disclosure. As shown in FIG. 9, the poly field plate does not affect the blocking voltage of the anode electrode of the semiconductor device. However, without the poly field plate, an early take off of the current of the cathode electrode occurs under a voltage of about 150-175 volts. On the contrary, with the poly field plate, the blocking voltage of the cathode is increased to close to 225 volts. It reveals that the formation of the poly field plate significantly improves the blocking voltage of the semiconductor device.

The semiconductor devices 100a and 100b in accordance with some embodiments of the disclosure have the following advantages. The semiconductor device is a lateral fast recovery diode formed by one or more lateral bipolar junction transistors (BJTs). For example, each of the semiconductor devices 100a and 100b is a lateral fast recovery diode composed of a NPN BJT (e.g. the first bipolar junction transistor B1 shown in FIG. 1C) and a (parasitic) diode (e.g. the diode A1 shown in FIG. 1C), which is laterally coupled to the NPN BJT. When the semiconductor devices 100a and 100b are supplied with a forward voltage, the NPN BJT may increase the turn-on current of the diode, thereby meeting the requirement of a large forward current. When the semiconductor devices 100a and 100b are supplied with a reverse voltage, the lateral fast recovery diode may quickly cut off the reverse current, thereby effectively reducing the reverse recovery time (tRR) of the semiconductor device devices 100a and 100b. The area of the semiconductor device can be significantly reduced and the driving ability of the current is increased. In the semiconductor devices 100a and 100b of the embodiment of the present disclosure, a poly field plate is formed on the pn junction of the NPN BJTs (e.g. the first bipolar junction transistor B1 shown in FIG. 1C) to reduce the metal layers used in the subsequent processes, thereby preventing the early take off issue and leakage current, which generally occur when metal layers are formed laterally across the semiconductor device. Also, the blocking voltage of the semiconductor devices 100a and 100b are effectively increased. In some embodiments, when the semiconductor device is formed on a silicon on insulator (SOI) substrate, the latch-up effect generated by a parasitic bipolar junction transistor (BJT) may be further suppressed. Therefore, the leakage current is also significantly suppressed.

Additionally, in some other embodiments, the isolation feature 201 may have a greater width with an increase of the width of the third well doped region 212. Since the high electric field area is farther away from the pn junction, an electric field distribution with a smoother curve is produced. Therefore, the blocking voltage of the semiconductor device 100a can be increased. In some other embodiments, the second well doped region 208, which is coupled to the anode electrode 226, and the third well doped region 212, which is coupled to the cathode electrode 228, are composed of a plurality of strip-shaped sub-well doped regions separated from each other. Therefore, the total dopant concentrations of the second well doped region 208 and the third well doped region 212 may be reduced while improving the high-voltage endurance of the semiconductor device.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   a substrate;
   a buried oxide layer disposed on the substrate;
   a semiconductor layer having a first conduction type disposed on the buried oxide layer;
   a first well doped region having the first conduction type disposed in the semiconductor layer;
   a second well doped region and a third well doped region having a second conduction type opposite to the first conduction type, disposed close to opposite sides of the first well doped region, wherein the second well doped region and the third well doped region are respectively separated from the first well doped region by a first distance and a second distance;
   an isolation feature covering the first well doped region and the third well doped region;
   a poly field plate having the first conduction type or the second conduction type disposed on the isolation feature and over the semiconductor layer between the first well doped region and the third well doped region;
   a first anode doped region having the second conduction type disposed on the second well doped region;
   a second anode doped region having the first conduction type disposed on the second well doped region;
   a third anode doped region having the first conduction type disposed on the second well doped region, wherein the second anode doped region is positioned directly on the third anode doped region; and
   a first cathode doped region having the second conduction type coupled to the third well doped region.

2. The semiconductor device as claimed in claim 1, wherein a dopant concentration of the second anode doped region is greater than that of the third anode doped region and a dopant concentration of the third anode doped region is greater than that of the first well doped region.

3. The semiconductor device as claimed in claim 1, wherein the second well doped region is composed of a plurality of strip-shaped second sub-well doped regions separated from each other, and wherein the strip-shaped second sub-well doped regions extend from a surface of the semiconductor layer down to the buried oxide layer.

4. The semiconductor device as claimed in claim 1, wherein the first anode doped region, the second anode doped region, and the third anode doped region are coupled to an anode electrode.

5. The semiconductor device as claimed in claim 1, wherein the first cathode doped region is coupled to a cathode electrode.

6. The semiconductor device as claimed in claim 1, further comprising:
   a fourth well doped region having the second conduction type, wherein the fourth well doped region is adjacent to a side of the third well doped region, which is away from a side of the first well doped region; and a second cathode doped region having the second conduction type, wherein the first cathode doped region and the second cathode doped region are disposed on the fourth well doped region, and the first cathode doped region is positioned directly on the second cathode doped region.

7. The semiconductor device as claimed in claim 6, wherein a dopant concentration of the first cathode doped region is greater than that of the second cathode doped region, and the dopant concentration of the second cathode doped region is greater than that of the fourth well doped region.

8. The semiconductor device as claimed in claim 6, wherein the third well doped region is composed of a plurality of strip-shaped third sub-well doped regions, and wherein the strip-shaped third sub-well doped regions extend from a surface of the semiconductor layer down to the buried oxide layer.

9. The semiconductor device as claimed in claim 8, wherein one of the strip-shaped third sub-well doped regions is adjacent to the fourth well doped region and separated from another of the strip-shaped third sub-well doped regions adjacent thereto by a first space, and the first space is greater than a width of each of the strip-shaped third sub-well doped regions.

10. The semiconductor device as claimed in claim 1, wherein the second anode doped region and the third anode doped region partially overlap with the second well doped region.

11. The semiconductor device as claimed in claim 10, wherein the second anode doped region is separated from the first well doped region by a third distance that is smaller than the first distance.

12. The semiconductor device as claimed in claim 11, wherein the second well doped region, the first well doped region, the third well doped region and the first cathode doped region collectively form a first bipolar junction transistor, wherein the second well doped region serves as a collector of the first bipolar junction transistor, the first well doped region serves as a base of the first bipolar junction transistor, and the third well doped region and the first cathode doped region serve as an emitter of the first bipolar junction transistor.

13. The semiconductor device as claimed in claim 12, wherein the second anode doped region, the third anode doped region, the first well doped region, the third well doped region, and the first cathode doped region collectively form a diode, wherein the second anode doped region, the third anode doped region and the first well doped region serve as a first electrode of the diode, and the third well doped region and the first cathode doped region serve as a second electrode of the diode.

14. The semiconductor device as claimed in claim 13, wherein the base of the first bipolar junction transistor is coupled to the first electrode of the diode, the emitter of the first bipolar junction transistor is coupled to the second electrode of the diode.

15. The semiconductor device as claimed in claim 13, wherein the first conduction type is p-type and the second conduction type is n-type, the first bipolar junction transistor is an NPN bipolar junction transistor, and the first electrode and the second electrode of the diode are respectively an anode electrode and a cathode electrode.

16. A method for forming a semiconductor device, comprising:
providing a substrate;
forming a buried oxide layer on the substrate;
forming a semiconductor layer on the buried oxide layer, wherein the semiconductor layer has a first conduction type;
forming a first well doped region in the semiconductor layer, wherein the first well doped region has the first conduction type;
forming a second well doped region and a third well doped region close to opposite sides of the first well doped region, wherein the second well doped region and the third well doped region are respectively separated from the first well doped region by a first distance and a second distance, wherein the second well doped region and the third well doped region have a second conduction type opposite to the first conduction type;
forming an isolation feature covering the first well doped region and the third well doped region;
forming a poly field plate on the isolation feature and over the semiconductor layer between the first well doped region and the third well doped region, wherein the poly field plate has the first conduction type or the second conduction type;
forming a first anode doped region on the second well doped region, wherein the first anode doped region has the second conduction type;
forming a second anode doped region on the second well doped region, wherein the second anode doped region has the first conduction type;
forming a third anode doped region on the second well doped region, wherein the third anode doped region has the first conduction type, wherein the second anode doped region is formed directly on the third anode doped region; and
forming a first cathode doped region coupled to the third well doped region, wherein the first cathode doped region has the second conduction type.

17. The method for forming the semiconductor device as claimed in claim 16, wherein a dopant concentration of the second anode doped region is greater than that of the third anode doped region and a dopant concentration of the third anode doped region is greater than that of the first well doped region.

18. The method for forming the semiconductor device as claimed in claim 16, wherein the second anode doped region and the third anode doped region partially overlap with the second well doped region.

19. The method for forming the semiconductor device as claimed in claim 16, wherein the second anode doped region is separated from the first well doped region by a third distance that is smaller than the first distance.

20. The method for forming the semiconductor device as claimed in claim 16, wherein the second well doped region is composed of a plurality of strip-shaped second sub-well doped regions separated from each other, wherein the strip-shaped second sub-well doped regions extend from a surface of the semiconductor layer down to the buried oxide layer.

21. The method for forming the semiconductor device as claimed in claim 16, wherein the first anode doped region, the second anode doped region, and the third anode doped region are coupled to an anode electrode.

22. The method for forming the semiconductor device as claimed in claim 16, wherein the first cathode doped region is coupled to a cathode electrode.

23. The method for forming the semiconductor device as claimed in claim 16,
before forming the isolation feature, forming a fourth well doped region adjacent to a side of the third well doped region, which is away from the first well doped region, wherein the fourth well doped region has the second conduction type, and forming a second cathode doped region having the second conduction type, wherein the first cathode doped region and the second cathode doped region are formed on the fourth well doped region, wherein the first cathode doped region is formed directly on the second cathode doped region.

24. The method for forming the semiconductor device as claimed in claim 23, wherein a dopant concentration of the first cathode doped region is greater than that of the second cathode doped region, and the dopant concentration of the of the second cathode doped region is greater than that of the fourth well doped region.

25. The method for forming the semiconductor device as claimed in claim 23, wherein the third well doped region is composed of a plurality of strip-shaped third sub-well doped regions separated from each other, wherein the strip-shaped third sub-well doped regions extend from a surface of the semiconductor layer down to the buried oxide layer.

26. The method for forming the semiconductor device as claimed in claim 25, wherein one of the strip-shaped third sub-well doped regions is adjacent to the fourth well doped region and separated from another of the strip-shaped third sub-well doped regions adjacent thereto by a first space, and the first space is greater than a width of each of the strip-shaped third sub-well doped regions.

* * * * *